(12) United States Patent
Du et al.

(10) Patent No.: US 10,908,495 B2
(45) Date of Patent: Feb. 2, 2021

(54) PHOTOLITHOGRAPHY PROCESS AND PHOTOLITHOGRAPHY APPARATUS

(71) Applicants: Semiconductor Manufacturing International (Shanghai) Corporation, Shanghai (CN); Semiconductor Manufacturing International (Beijing) Corporation, Beijing (CN)

(72) Inventors: Yao Jun Du, Shanghai (CN); Liang Li, Shanghai (CN); Juan Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 353 days.

(21) Appl. No.: 16/101,631

(22) Filed: Aug. 13, 2018

(65) Prior Publication Data
US 2019/0064655 A1 Feb. 28, 2019

(30) Foreign Application Priority Data
Aug. 24, 2017 (CN) .......................... 2017 1 0734995

(51) Int. Cl.
G03F 1/36 (2012.01)
G03F 1/44 (2012.01)
G03F 1/26 (2012.01)
G03F 7/20 (2006.01)

(52) U.S. Cl.
CPC ................. *G03F 1/36* (2013.01); *G03F 1/26* (2013.01); *G03F 1/44* (2013.01); *G03F 7/70125* (2013.01); *G03F 7/70441* (2013.01)

(58) Field of Classification Search
CPC ..... G03F 1/26; G03F 1/36; G03F 1/44; G03F 7/70125; G03F 7/70441
USPC ....................................................... 430/5, 30
See application file for complete search history.

(56) References Cited

FOREIGN PATENT DOCUMENTS

| CN | 101957556 A | 1/2011 |
| CN | 102193303 A | 9/2011 |

*Primary Examiner* — Christopher G Young
(74) *Attorney, Agent, or Firm* — Anova Law Group, PLLC (57) ABSTRACT

A photolithography process includes providing a first test layout including test patterns, and a first light source; forming an initial mask layout according to the first test layout; forming a mask layout including mask layout patterns through an optical proximity correction or a phase-shifting masking; forming exposed patterns by exposing the mask layout using the first light source; and determining a weak region from the first test layout. A first distance between adjacent test patterns in the weak region is unequal to a second distance between corresponding exposed patterns. The photolithography process further includes performing a re-layout on the weak region to increase the first distance, thereby providing an adjusted test layout; performing a light-source optimization to obtain an adjusted light source; and determining the adjusted test layout and the adjusted light source as a second test layout and a second light source, respectively when process window requirements are satisfied.

19 Claims, 3 Drawing Sheets

PHOTOLITHOGRAPHY PROCESS AND PHOTOLITHOGRAPHY APPARATUS

CROSS-REFERENCES TO RELATED APPLICATIONS

This application claims the priority of Chinese Patent Application No. CN201710734995.8, filed on Aug. 24, 2017, the entire content of which is incorporated herein by reference.

FIELD OF THE DISCLOSURE

The present disclosure generally relates to the field of semiconductor fabrication technology and, more particularly, relates to a photolithography process and a photolithography apparatus.

BACKGROUND

Photolithography is a very important technology in semiconductor manufacturing that can transfer a graphic pattern from a mask plate to the surface of a silicon wafer so that a semiconductor product that meets the design requirements may be formed.

In semiconductor manufacturing, with the continuous reduction of the design dimension, the design dimension is already close to or even less than the wavelength of the light used in the photolithography process. Therefore, the diffraction effect and the interference effect of light become more and more prominent, which may cause serious distortion of the actually-formed photolithography pattern with respect to the designed pattern. This phenomenon is known as the optical proximity effect (OPE).

Optical proximity correction (OPC) is the main technique for suppressing the OPE. However, as the feature size of semiconductor devices further decreases, the OPE may be difficult to meet the process requirements. To solve the problem, a source-mask optimization (SMO) method is used in the photolithography process. The SMO method is a technique that can mutually optimize the light-source and the mask pattern, such that the conventional photolithography technique may thus be applicable for the fabrication of semiconductor components with smaller sizes.

During the photolithography process, due to the vibration of the substrate and the light source, the dimension of the actual pattern formed after photolithography may easily deviate from the dimension of the pattern according to the design requirements. In the field of photolithography technology, the stability of the photolithography process may be determined based on the photolithography process window. The photolithography process window may be the maximum fluctuation range of the substrate or the light source that is allowed by the photolithography process when the difference between the size of the actual pattern formed after the photolithography process and the size of the pattern required by the design is in a certain range.

However, the process window of existing photolithography processes using the SMO technique is still relatively small. The disclosed photolithography process and photolithography apparatus are directed to solve one or more problems set forth above and other problems in the art.

BRIEF SUMMARY OF THE DISCLOSURE

One aspect of the present disclosure provides a photolithography process. The photolithography process includes providing a first test layout and a first light source, the first test layout including a plurality of test patterns; and forming a mask layout according to the first test layout, including forming an initial mask layout according to the first test layout, and performing at least one of an optical proximity correction (OPC) and a phase-shifting masking (PSM) on the initial mask layout to form the mask layout. The initial mask layout is substantially same as or proportional to the first test layout, and the mask layout includes a plurality of mask layout patterns. The photolithography process also includes forming a plurality of exposed patterns by exposing the mask layout using the first light source; and determining a weak region, including a plurality of test patterns, from the first test layout. The distance between adjacent test patterns in the weak region is a first distance, the distance between adjacent exposed patterns that correspond to the test patterns is a second distance, and the first distance is unequal to the second distance. The photolithography process further includes performing a re-layout on the weak region to increase the first distance between adjacent test patterns in the weak region, thereby providing an adjusted test layout; performing a light-source optimization to obtain an adjusted light source according to the adjusted test layout; and determining the adjusted test layout as a second test layout and the adjusted light source as a second light source when requirements by a photolithography process window are satisfied using the adjusted test layout and the adjusted light source.

Another aspect of the present disclosure provides a photolithography apparatus. The photolithography apparatus includes an input device, configured to provide a first test layout and a first light source. The first test layout includes a plurality of test patterns. The photolithography apparatus also includes a mask layout formation device, configured to form a mask layout according to the first test layout; an exposure device, configured to form a plurality of exposed patterns by exposing the mask layout using the first light source; and a weak region acquisition device, configured to obtain a weak region including a plurality of test patterns in the first test layout. The distance between adjacent test patterns in the weak region is a first distance, the distance between adjacent exposed patterns that correspond to the test patterns is a second distance, and the first distance is unequal to the second distance. The photolithography apparatus further includes a re-layout device, configured to increase the distance between adjacent test patterns in the weak region by performing a re-layout one or multiple times on the weak region; and a light-source optimization device, configured to perform a light-source optimization one or multiple times on the light source according to the first test layout.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The existing photolithography processes need to be improved. For example, the photolithography process window may still be relatively small. In the following, a photolithography process is provided to illustrate the reasons that may lead to a relatively small process window for the photolithography process.

Figure 1:
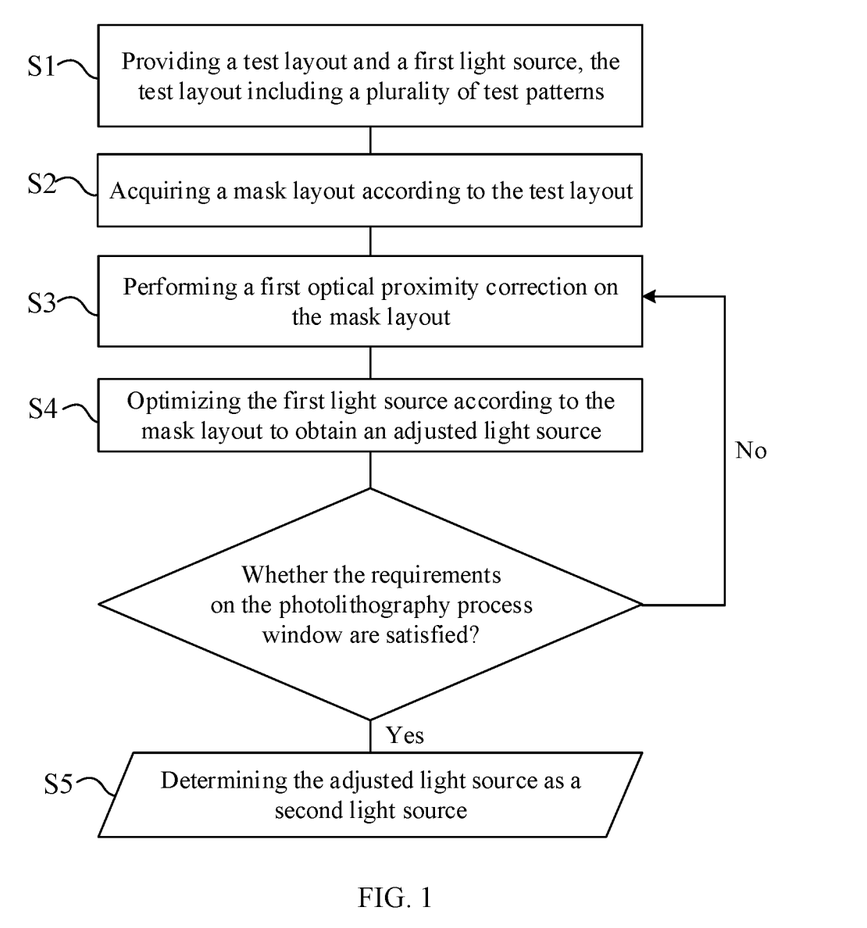
FIG. 1 illustrates a flowchart of a photolithography process.

FIG. 1 illustrates a flowchart of a photolithography process. Referring to FIG. 1, the photolithography process may include executing Step S1 to provide a test layout and a first light source, the test layout including a plurality of test patterns; executing Step S2 to acquire a mask layout according to the test patterns; executing Step S3 to perform a first optical proximity correction (OPC) on the mask layout; executing Step S4 to optimize the first light source according to the mask layout; repeating Step S3 and Step S4 to satisfy the requirements by the photolithography process window, and executing Step S5 to acquire the light source and thus obtain a second light source. In one embodiment, the requirements by the photolithography process window may include that the photolithography process window is greater than a preset value. When the requirements by the photolithography process window are satisfied, the light source may be determined as the second light source according to Step S5.

The photolithography process further includes providing a photoresist layer and a to-be-formed layout, providing the second light source obtained through the photolithography process described in FIG. 1, and forming an initial chip mask layout according to the to-be-formed layout. The initial chip mask layout may be substantially the same as or proportional to the to-be-formed layout. The initial chip mask layout may include a plurality of initial chip mask patterns. Further, the photolithography process includes performing a second OPC on the initial chip mask layout using the second light source and the to-be-formed layout to obtain a chip mask layout. The chip mask layout includes a plurality of chip mask patterns. The photolithography process further includes forming a chip mask plate according to the chip mask layout, and exposing the photoresist layer by the second light source using the chip mask plate as a mask to form a plurality of exposed patterns.

In the above photolithography process, the chip mask plate is formed according to the to-be-formed layout, and the plurality of exposed patterns are obtained using the second light source and the chip mask plate. The to-be-formed layout includes a plurality of intended patterns. When the distance between adjacent intended patterns in the to-be-formed layout is too small, the interplay of the corresponding initial chip mask patterns in the initial chip mask layout is significant, which may lead to undesired correction for the second OPC, and thus the sizes of the exposed patterns may become smaller than the sizes of the intended patterns. Therefore, to ensure that the sizes of the exposed patterns are able to meet the requirements, the requirements of the exposure process may need to be more stringent, and thus the photolithography process window may be relatively small.

Figure 2:
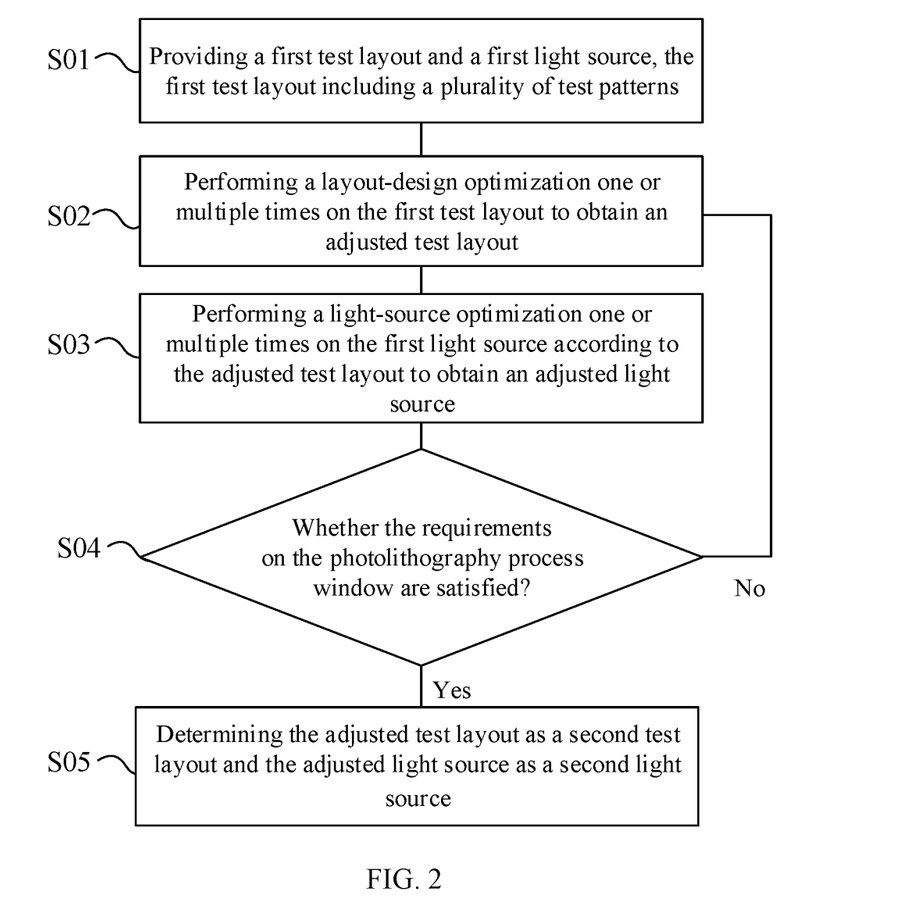
FIG. 2 illustrates a flowchart of an exemplary photolithography process consistent with various embodiments of the present disclosure.

The present disclosure provides a photolithography process. FIG. 2 illustrates a flowchart of an exemplary photolithography process consistent with various embodiments of the present disclosure.

Referring to FIG. 2, the photolithography process may include the following exemplary steps.

In Step S01, a first test layout, including a plurality of test patterns, and a first light source may be provided. The first test layout and the first light source may be used for a layout-design optimization and a light-source optimization. The first test layout may include patterns that may be formed in subsequent manufacturing processes. For example, the first test layout may include a plurality of test patterns.

In Step S02, a layout-design optimization may be performed one or multiple times on the first test layout to obtain an adjusted test layout.

In Step S03, a light-source optimization may be performed one or multiple times on the first light source according to the optimized test layout to obtain an optimized light source.

In one embodiment, the photolithography process may include performing each of the layout-design optimization and the light-source optimization for one time to obtain a second test layout and a second light source. In other embodiments, the photolithography process may include performing the layout-design optimization for multiple times and/or the light-source optimization for multiple times to obtain a second test layout and a second light source.

The layout-design optimization may be performed to optimize the first test layout such that the distortion of the exposed patterns formed in a subsequent process may be reduced. In one embodiment, the layout-design optimization may be performed one or multiple times. The layout-design optimization may be able to optimize the first test layout. Therefore, the distortion of the subsequently-formed exposed patterns according to the test patterns in a weak region may be reduced. As such, the requirements of the photolithography conditions may be reduced for the obtained second test layout, and the photolithography process window may be increased.

It should be noted that during a chip fabrication process, because various factors such as the fluctuation of the substrate and the light source may affect the photolithography results, the size of a chip pattern formed after the photolithography process may be easily different from the size of the corresponding pattern of the to-be-formed layout according to the design request. The photolithography process window may be the maximum fluctuation range of the substrate or the light source that is allowed by the photolithography process when the difference between the size of the actual pattern formed after the photolithography process and the size of the pattern required by the design is in a certain range.

Figure 3:
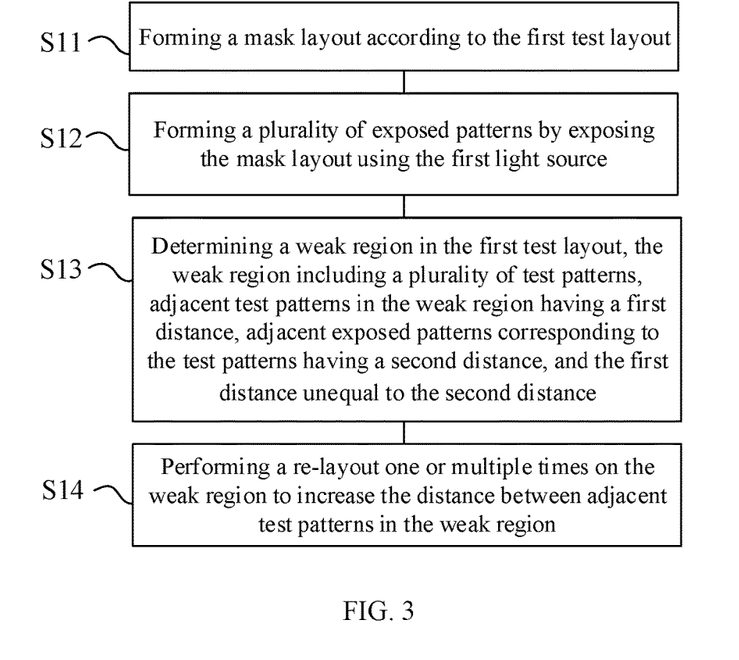
FIG. 3 illustrates a flowchart of a layout-design optimization in an exemplary photolithography process consistent with various embodiments of the present disclosure.

FIG. 3 illustrates a flowchart of a layout-design optimization in an exemplary photolithography process consistent with various embodiments of the present disclosure.

Referring to FIG. 3, the layout-design optimization may include the following exemplary steps.

In Step S11, a mask layout may be formed according to the first test layout. In one embodiment, when performing the at least one time of the optimization process, the step for forming the mask layout according to the first test layout may further include forming an initial chip mask layout according to the first test layout and then forming the mask layout by performing a mask optimization on the initial chip mask layout. The initial chip mask layout may be substantially the same as or proportional to the first test layout with a ratio, and the mask layout may include a plurality of mask patterns.

The initial chip mask layout substantially the same as the first test layout may refer to that the shape, size, and position of each pattern in the initial chip mask layout may be substantially the same as the shape, size, and position of the corresponding pattern in the first test layout. The initial chip mask layout proportional to the first test layout with a ratio may refer to the shape and position of each pattern in the initial chip mask layout may be the same as the shape and position of the corresponding pattern in the first test layout, and the size of the pattern in the initial chip mask layout and the size of the corresponding pattern in the first test layout may have a ratio unequal to 1.

The initial chip mask layout may include a plurality of initial mask patterns. The initial mask patterns may be substantially the same as or similar to the test patterns. After performing the mask optimization, the plurality of initial mask patterns may form the plurality of mask patterns.

Performing the mask optimization may include performing an OPC or a phase-shifting masking (PSM).

When the number of the times that the mask optimization is performed on the initial chip mask layout is too large during the step for forming the mask layout according to the first test layout, it may easily result in enhanced computational complexity. When the number of the times that the mask optimization is performed on the initial chip mask layout is too small during the step for forming the mask layout according to the first test layout, it may not be conducive to increasing the process window. In one embodiment, during the step for forming the mask layout according to the first test layout, the number of the times that the mask optimization is performed on the initial chip mask layout may be in a range of approximately 1 to 3. That is, the OPC or the PSM may be performed approximately 1 to 3 times. In other embodiments, during the step for forming the mask layout according to the first test layout, the number of the times that the mask optimization is performed on the initial chip mask layout may have other values. For example, the number of the times that the mask optimization is performed on the initial chip mask layout may be 5, i.e., the OPC or the PSM may be performed on the initial chip mask layout 5 times.

In some other embodiments, the step for forming the mask layout according to the first test layout may not include performing the mask optimization. Therefore, the step for forming the mask layout according to the first test layout may include forming a mask layout which is substantially the same as or proportional to the first test layout with a certain ratio.

Further, referring to FIG. 3, in Step S12, a plurality of exposed patterns may be formed by exposing the mask layout using the first light source. The plurality of exposed patterns may be formed by exposing the plurality of mask patterns in the mask layout.

Moreover, when the distance between adjacent test patterns is too small, after forming the exposed patterns according to the test patterns, the formed exposed patterns may be easily distorted, leading to an increase in the distance between adjacent exposed patterns, and a decrease in the sizes of the exposed patterns. To ensure that the plurality of exposed patterns can meet the design requirements, the requirements of the photolithography process (such as the vibration of the substrate, the vibration of the light source, etc.) may need to be more stringent, which may result in reducing the process window.

The exposure of the mask layout may be simulated exposure. For example, the information of the exposed patterns formed after exposure may be calculated based on the optical principle of the interrelation between the first light source and the mask layout.

Further, referring to FIG. 3, in Step S13, a weak region may be determined from the first test layout. The weak region may include a plurality of test patterns. Adjacent test patterns in the weak region may have a first distance, adjacent exposed patterns that correspond to the test patterns may have a second distance, and the first distance may be unequal to the corresponding second distance.

The step for determining the weak region may include determining a first distance between adjacent test patterns in the first test layout and a second distance between adjacent exposed patterns that correspond to the test patterns, and when the first distance is unequal to the second distance, acquiring the region of the adjacent test patterns to obtain the weak region. For example, for two adjacent test patterns in the first test layout, the distance between the adjacent test patterns may be determined as a first distance. Further, the distance between the adjacent exposed patterns that correspond to the test patterns may be determined as a second distance. Moreover, when the first distance is smaller than the second distance, the region containing the adjacent test patterns in the first test layout may be determined as the weak region.

Further, referring to FIG. 3, in Step S14, a re-layout may be performed one or multiple times on the weak region to increase the distance between adjacent test patterns in the weak region, and thus obtain an adjusted test layout.

When the number of the times that the re-layout is performed on the weak region of the first test layout is too large during a layout-design optimization, it may easily result in enhanced computational complexity. When the number of the times that the re-layout is performed on the weak region of the first test layout is too small during a layout-design optimization, it may not be conducive to increasing the process window for the adjusted test layout. In one embodiment, during a layout-design optimization, the number of the times that the re-layout is performed on the weak region of the first test layout may be in a range of approximately 1 to 3. In other embodiments, during a layout-design optimization, the number of the times that the re-layout is performed on the weak region of the first test layout may have other values. For example, the number of the times that the re-layout is performed on the weak region of the first test layout may be 5.

The re-layout may include acquiring a distance incremental amount $\Delta f$ of the distance between adjacent test patterns, increasing the distance between adjacent test patterns in the weak region, such that the distance between adjacent test patterns may be increased by the distance incremental amount $\Delta f$.

The distance incremental amount $\Delta f$ of the distance between adjacent test patterns may be acquired through finite-difference computation performed based on the exposed patterns and the test patterns. For example, a Cartesian coordinate system may be established on the test patterns, the horizontal axis of the Cartesian coordinate system may be an x-axis, and the vertical axis of the Cartesian coordinate system may be a y-axis. The distance incremental amount Δf may be obtained according to the following equation:

$$\Delta f = T_i^{-1} \Delta E_{pei}; \Delta E_{pei} = CD_i(\text{spec}) - CD_i(\text{contour}) (i = x, y);$$

where, i=x represents that the i direction is along the x-axis direction; and 1=y represents that the i direction is along they-axis direction; $CD_i(\text{spec})$ is the dimension of the test pattern along the i direction; $CD_i(\text{contour})$ is the dimension of the exposed pattern along the i direction.

As such, $$T_i = \frac{\partial E_{pei}}{\partial f_i};$$

Therefore, $T_i$ may be obtained through finite-difference computation. For example, $$T_i = \frac{\partial E_{pei}}{\partial f_i} = \frac{Epe(fi + 1nm) - Epe(fi)}{1nm}.$$

In other embodiments, after performing the re-layout, the optimization process may also include performing an optical proximity optimization on the mask layout according to the adjusted test layout obtained after the re-layout. The optical proximity optimization may include an OPC or a PSM.

When the number of the times that the layout optimization is performed on the patterns in the weak region of the first test layout is too large during an optimization process, it may easily result in enhanced computational complexity. When the number of the times that the layout optimization is performed on the patterns in the weak region of the first test layout is too small during an optimization process, it may not be conducive to increasing the process window. In one embodiment, during an optimization process, the number of the times that the layout optimization is performed on the patterns in the weak region of the first test layout may be in a range of approximately 1 to 3. In other embodiments, during an optimization process, the number of the times that the layout optimization is performed on the patterns in the weak region of the first test layout may have other values. For example, the number of the times that the layout optimization is performed on the patterns in the weak region of the first test layout may be 5.

Further, referring to FIG. 2, Step S03 may be executed. In Step S03, a light-source optimization may be performed one or multiple times on the first light source according to the adjusted test layout. The light-source optimization may be used to optimize the first light source and thus obtain an adjusted light source that can increase the process window.

The light-source optimization may include a method based on a genetic algorithm or a particle swarm optimization (PSO) algorithm. During the light-source optimization, the distribution, intensity, and exposure time of the light source may be adjusted to obtain the adjusted light source.

When the number of the times that the light-source optimization is performed on the first light source according to the adjusted test layout is too large during an optimization process, it may easily result in enhanced computational complexity. When the number of the times that the light-source optimization is performed on the first light source according to the adjusted test layout is too small during an optimization process, it may not be conducive to increasing the process window. In one embodiment, during an optimization process, the number of the times that the light-source optimization is performed on the first light source according to the adjusted test layout may be in a range of approximately 1 to 3. In other embodiments, during an optimization process, the number of the times that the light-source optimization is performed on the first light source according to the adjusted test layout may have other values. For example, the number of the times that the light-source optimization is performed on the first light source according to the adjusted test layout may be 5.

In one embodiment, after performing the layout-design optimization one or multiple times on the first test layout to obtain an adjusted test layout, the light-source optimization may be performed one or multiple times on the first light source according to the adjusted test layout to obtain an adjusted light source. That is, the light-source optimization may be performed one or multiple times according to the adjusted test layout obtained after performing the layout-design optimization one or multiple times.

In other embodiments, a light-source optimization may be performed one or multiple times on the first light source according to the first test layout to obtain an adjusted light source, and a layout optimization may then be performed one or multiple times on the first test layout to obtain an adjusted test layout based on the adjusted light source obtained after performing the light-source optimization one or multiple times.

Further, referring to FIG. 2, Step S04 may be executed. In Step S04, whether the photolithography process window according to the adjusted light source and the adjusted test layout obtained after the optimization process matches the requirements may be determined. When the requirements are not satisfied, the steps of the optimization process described above may be repeated. When the requirements are satisfied, Step S05 may be executed.

In Step S05, the adjusted test layout may be determined as a second test layout, and the adjusted light source may be determined as a second light source.

In one embodiment, the photolithography process window may be increased by repeating the steps of the optimization process described above.

It should be noted that during a chip fabrication process, because various factors such as the fluctuation of the substrate and the light source may affect the photolithography results, the size of a chip pattern formed after the photolithography process may be easily different from the size of the corresponding pattern of the to-be-formed layout according to the design request. The photolithography process window may be the maximum fluctuation range of the substrate or the light source that is allowed by the photolithography process when the difference between the size of the actual pattern formed after the photolithography process and the size of the pattern required by the design is in a certain range.

In one embodiment, the photolithography process may be simulated using the adjusted light source and the adjusted test layout such that a photolithography process window may be obtained. Moreover, the photolithography process window may be compared to the design requirements.

It should be noted that the adjusted test layout and the adjusted light source may be used to optimize the design of the new layout. As such, distortion of the exposed patterns may be reduced, and the photolithography process window may be increased.

Figure 4:
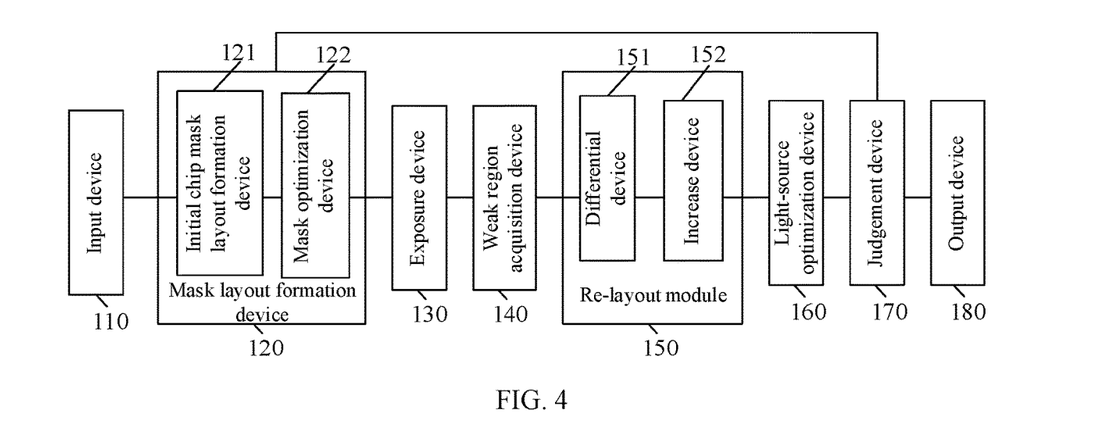
FIG. 4 illustrates a schematic structural view of an apparatus for an exemplary photolithography process consistent with various embodiments of the present disclosure.

The present disclosure also provides an apparatus for optimizing photolithography process. FIG. 4 illustrates a schematic structural view of an apparatus for an exemplary photolithography process consistent with various embodiments of the present disclosure.

Referring to FIG. 4, the apparatus for optimizing photolithography process may include an input device 110, configured to provide a first test layout, including a plurality of test patterns, and a first light source; a mask layout formation device 120, configured to form a mask layout according to the first test layout; an exposure device 130, configured to form a plurality of exposed patterns by exposing the mask layout using the first light source; and a weak region acquisition device 140, configured to obtain a weak region in the first test layout. The weak region may include a plurality of test patterns. Adjacent test patterns in the weak region may have a first distance, adjacent exposed patterns that correspond to the adjacent test patterns may have a second distance, and the first distance may be unequal to the corresponding second distance. The apparatus for the photolithography process may also include a re-layout device 150, configured to increase the distance between adjacent test patterns in the weak region by performing a re-layout one or multiple times on the weak region; and a light-source optimization device 160, configured to perform a light-source optimization one or multiple times on the light source according to the first test layout.

The first test layout may include patterns that may be formed in subsequent manufacturing processes. For example, the first test layout may include a plurality of test patterns.

The mask layout formation device 120 may include an initial chip mask layout formation device 121, configured to form an initial chip mask layout according to the first test layout. The initial chip mask layout may be substantially the same as or proportional to the first test layout with a certain ratio. The mask layout formation device 120 may also include a mask optimization device 122, configured to form a mask layout by performing a mask optimization one or multiple times on the initial chip mask layout. The mask layout may include a plurality of mask patterns.

The initial chip mask layout substantially the same as the first test layout may refer to that the shape, size, and position of each pattern in the initial chip mask layout may be substantially the same as the shape, size, and position of the corresponding pattern in the first test layout. The initial chip mask layout proportional to the first test layout with a certain ratio may refer to the shape and position of each pattern in the initial chip mask layout may be the same as the shape and position of the corresponding pattern in the first test layout, and the size of the pattern in the initial chip mask layout and the size of the corresponding pattern in the first test layout may have a ratio unequal to 1.

The re-layout device 150 may include a differential device 151, configured to acquire a distance incremental amount $\Delta f$ through finite-difference computation performed based on the exposed patterns and the test patterns; and an increase device 152, configured to increase the distance between adjacent test patterns in the weak region, such that the distance between adjacent test patterns may be increased by the distance incremental amount $\Delta f$. As such, an adjusted test layout may be obtained according to the first test layout.

The differential device 151 may acquire the distance incremental amount $\Delta f$ of the distance between adjacent test patterns through finite-difference computation performed based on the exposed patterns and the test patterns. The principle for the differential device 151 to acquire the distance incremental amount $\Delta f$ is as follows: a Cartesian coordinate system may be established on the test patterns, the horizontal axis of the Cartesian coordinate system may be an x-axis, the vertical axis of the Cartesian coordinate system may be a y-axis; and the distance incremental amount $\Delta f$ may be obtained according to the following equation:

$$\Delta f = T_i^{-1} \Delta E_{pei}; \Delta E_{pei} = CD_i(\text{spec}) - CD_i(\text{contour}) (i=x,y);$$

where, i=x represents that the i direction is along the x-axis direction; and i=y represents that the i direction is along they-axis direction; $CD_i(\text{spec})$ is the dimension of the test pattern along the i direction; $CD_i(\text{contour})$ is the dimension of the exposed pattern along the i direction.

As such, $$T_i = \frac{\partial E_{pei}}{\partial f_i};$$

Therefore, $T_i$ may be obtained through finite-difference computation. For example, $$T_i = \frac{\partial E_{pei}}{\partial f_i} = \frac{Epe(fi+1 \text{ nm}) - Epe(fi)}{1 \text{ nm}}.$$

The light-source optimization device 160 may be able to perform a light-source optimization one or multiple times on the first light source to obtain an adjusted light source. The light-source optimization may include a method based on a genetic algorithm or a PSO algorithm. During the light-source optimization, the distribution, intensity, and exposure time of the light source may be adjusted to obtain the adjusted light source.

The apparatus for photolithography process may also include a judgement device 170, configured to simulate the photolithography process according to the adjusted light source and the adjusted test layout obtained after the optimization process, determine whether the photolithography process window meets the process requirements; and an output device 180, configured to, in response to the judgement device 170 determining that the photolithography process window meets the process requirements, output the adjusted light source obtained after optimizing photolithography process as a second light source, and also output the adjusted test layout after optimizing photolithography process as a second test layout.

The judgement device 170 may analyze the optimization result and determine whether the photolithography process window meets the process requirements. When the process requirements are satisfied, the adjusted test layout and the adjusted light source may then be output through the output device 180. When the process requirements are not satisfied, the judgement device 170 may return the adjusted test layout and the adjusted light source back to the mask layout optimization device 120 to initiate another round of the optimization process.

The present disclosure also provides a photolithography process. The photolithography process may include the following exemplary steps.

A first test layout, a second test layout, and a second light source according to FIG. 2 may be provided. The second test layout and the second light source may be obtained from the first test layout and a first light source through a photolithography process illustrated in FIG. 2.

A first layout (i.e., a to-be-formed layout) and a base substrate may be provided. The first layout may include a replacement region. The replacement region may be substantially identical to the weak region of the first test layout. The weak region of the first test layout that is substantially identical to the replacement region may be an identical region. The first layout may include a plurality of intended patterns.

The replacement region substantially the same as the weak region of the first test layout may refer to that the shape, size, and relative position of each intended pattern in the replacement region may be substantially the same as the shape, size, and relative position of the corresponding test pattern in the weak region of the first test layout.

In one embodiment, the first layout may include a matching region. The matching region may be substantially the same as the first test layout before the photolithography process is optimized. In other embodiments, the first layout may only include a portion of the first test layout before the photolithography process is optimized.

The matching region may include a plurality of intended patterns. The shape, size, and relative position of each intended pattern may be substantially the same as the shape, size, and relative position of the corresponding test pattern in the first test layout before the photolithography process is optimized.

The region of the second test layout that corresponds to the weak region of the first test layout may be an optimization region. In one embodiment, the optimization region may be used to replace the replacement region of the first layout and thus form a second layout (i.e., an optimized layout).

In one embodiment, the matching region of the first layout may be substantially the same as the first test layout before the photolithography process is optimized. Thus, by replacing the matching region with the second test layout, the optimization region may be able to replace the replacement region of the first layout.

In other embodiments, only the optimization region of the second test layout may be used to replace the replacement region of the first layout.

Moreover, because the photolithography process may include one or more optimizations, a plurality of test layouts may be formed during the photolithography process. Therefore, the number of the test layouts provided in the photolithography process may be one or more than one. The replacement region may be substantially identical to the weak region of any test layout. The weak region of the test layout that is substantially identical to the replacement region may be an identical region.

The base substrate may include a substrate and a photoresist layer formed on the substrate. The photoresist layer may be made of a photoresist material. The substrate may be made of silicon, germanium, SiGe, silicon on semiconductor, germanium on semiconductor, SiGe on semiconductor, silicon on insulator, germanium on insulator, SiGe on insulator, etc.

The region of the second test layout that corresponds to the identical region may be an optimization region. In one embodiment, the optimization region may be used to replace the replacement region of the first layout and thus form a second layout.

The second layout may be able to reduce the distortion of the patterns in the replacement region of the first layout that occurs after exposure. As such, the requirements of the photolithography conditions may be reduced for the second layout, and thus the process window for forming the chip may be increased.

Further, a chip mask plate may be obtained according to the second layout. Obtaining the chip mask plate according to the second layout may include the following exemplary steps. An initial chip mask layout may be formed according to the second layout. The initial chip mask layout may be substantially the same as or proportional to the second layout with a certain ratio. A chip-mask optimization may be performed one or multiple times on the initial chip mask layout to obtain an optimized chip mask layout. Further, the chip mask plate may be formed according to the optimized chip mask layout.

The method used for the chip-mask optimization may include an OPC method or a PSM method.

The initial chip mask layout substantially the same as the second layout may refer to that the shape, size, and position of each pattern in the initial chip mask layout may be substantially the same as the shape, size, and position of the corresponding pattern in the second layout. The initial chip mask layout proportional to the second layout with a certain ratio may refer to the shape and position of each pattern in the initial chip mask layout may be the same as the shape and position of the corresponding pattern in the second layout, and the size of the pattern in the initial chip mask layout and the size of the corresponding pattern in the second layout may have a ratio unequal to 1.

Further, a plurality of lithography patterns may be formed on the base substrate by exposing the base substrate to the adjusted light source using the chip mask plate as a mask.

In one embodiment, the second layout may be able to reduce the distortion of photolithography patterns formed in the replacement region of the first layout, and thus reduce the requirements of the exposure conditions for the second layout. Therefore, under the condition that the formed photolithography patterns satisfy the design requirements, the fluctuation range of the light source or the substrate allowed by the exposure process may be large, and thus, the photolithography process may be able to increase the photolithography process window.

As compared to existing photolithography processes and photolithography apparatuses, the disclosed photolithography process and photolithography apparatus may demonstrate the following advantages.

According to the disclosed photolithography process, the layout-design optimization includes a re-layout performed one or multiple times on the weak region. The patterns in the mask layout formed by the test patterns in the weak region may be a plurality of weak mask patterns. The layout-design optimization may be able to increase the distance between adjacent test patterns in the weak region, and thus increase the distance between adjacent weak mask patterns. Therefore, the distortion of the exposed patterns due to the interplay of adjacent weak mask patterns may be reduced. As such, the disclosed photolithography process may be able to reduce the requirements of the photolithography conditions for the second test layout, and thus increase the photolithography process window.

According to the disclosed apparatus for the photolithography process, the apparatus includes a re-layout device. The re-layout device is used to perform the re-layout one or multiple times on the weak region of the first test layout. The patterns in the mask layout to formed by the test patterns in the weak region may be a plurality of weak mask patterns. The re-layout may be able to increase the distance between adjacent test patterns in the weak region, and thus the distortion of the exposed patterns due to the interplay of adjacent weak mask patterns may be reduced. As such, the disclosed apparatus for optimizing photolithography process may be able to reduce the requirements of the second test layout on the photolithography conditions, and thus increase the photolithography process window.

According to the disclosed photolithography process, an optimized layout (a second layout) is formed by using the optimization region in the second test layout to replace the replacement region of a to-be-formed layout (a first layout). The optimized layout may be able to reduce the distortion of the photolithography patterns formed according to the replacement region of the to-be-formed layout. Therefore, the requirements of the photolithography conditions may be reduced for the optimized layout, and thus the photolithography process window may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A photolithography process, comprising:
providing a first test layout and a first light source, the first test layout including a plurality of test patterns; and
forming a mask layout according to the first test layout, including:
   forming an initial mask layout according to the first test layout, wherein the initial mask layout is substantially same as or proportional to the first test layout, and
   performing at least one of an optical proximity correction (OPC) and a phase-shifting masking (PSM) on the initial mask layout to form the mask layout, wherein the mask layout includes a plurality of mask layout patterns;
forming a plurality of exposed patterns by exposing the mask layout using the first light source;
determining a weak region, including a plurality of test patterns, from the first test layout, wherein a distance between adjacent test patterns in the weak region is a first distance, a distance between adjacent exposed patterns that correspond to the test patterns is a second distance, and the first distance is unequal to the second distance;
performing a re-layout on the weak region to increase the first distance between adjacent test patterns in the weak region, thereby providing an adjusted test layout;
performing a light-source optimization to obtain an adjusted light source according to the adjusted test layout; and
determining the adjusted test layout as a second test layout and the adjusted light source as a second light source when requirements by a photolithography process window are satisfied using the adjusted test layout and the adjusted light source.

2. The photolithography process according to claim 1, wherein:
the mask layout is substantially same as the first test layout or proportional to the first test layout with a ratio.

3. The photolithography process according to claim 1, wherein:
the at least one of the OPC and the PSM is performed multiple times on the initial mask layout.

4. The photolithography process according to claim 1, wherein the re-layout of the weak region includes:
acquiring a distance incremental amount of the first distance between adjacent test patterns; and
increasing the first distance between adjacent test patterns in the weak region by the distance incremental amount.

5. The photolithography process according to claim 4, wherein:
the distance incremental amount is acquired by performing finite-difference computation based on the exposed patterns and the test patterns.

6. The photolithography process according to claim 1, wherein:
the re-layout of the weak region is performed multiple times on the weak region.

7. The photolithography process according to claim 1, wherein determining the weak region of the first test layout includes:
acquiring the first distance between adjacent test patterns of the first test layout and acquiring the second distance between the adjacent exposed patterns that correspond to the test patterns; and
when the first distance is unequal to the second distance, a region of the first test layout containing the adjacent test patterns is determined as the weak region.

8. The photolithography process according to claim 7, wherein:
when the first distance is smaller than the second distance, the region of the first test layout containing the adjacent test patterns is determined as the weak region.

9. The photolithography process according to claim 1, further including:
repeatedly performing:
   forming the mask layout according to the first test layout, forming the plurality of exposed patterns, determining the weak region, performing the re-layout on the weak region, and performing the light-source optimization, such that the requirements by the photolithography process window using the adjusted test layout and the adjusted light source are satisfied.

10. The photolithography process according to claim 9, wherein:
the requirements by the photolithography process window is satisfied when the photolithography process window is greater than a preset value.

11. The photolithography process according to claim 1, further including:
after obtaining the second light source by performing the light-source optimization, the second test layout is obtained according to the second light source.

12. The photolithography process according to claim 1, wherein:
the light-source optimization includes adjusting one or more of a light source distribution, a light intensity, and a exposure time, wherein the light-source optimization is performed using a method based on one of a genetic algorithm and a particle swarm optimization (PSO) algorithm to adjust the one or more of the light source distribution, the light intensity, and the exposure time.

13. The photolithography process according to claim 1, further including:
providing a to-be-formed layout and a base substrate, wherein the to-be-formed layout includes a replacement region substantially same as the weak region of the first test layout, and the weak region of the first test layout that is substantially identical to the replacement region is an identical region;

determining a region in the second test layout that corresponds to the identical region as an optimization region, and forming an optimized layout by replacing the replacement region in the to-be-formed layout with the optimization region;

acquiring a chip mask plate according to the optimized layout; and exposing the base substrate using the second light source through the chip mask plate to form a photolithographic pattern on the base substrate.

14. The photolithography process according to claim 13, wherein acquiring the chip mask plate according to the optimized layout includes:

forming an initial chip mask layout according to the optimized layout, wherein the initial chip mask layout is substantially same as or proportional to the optimized layer with a ratio;

performing a chip-mask optimization on the initial chip mask layout to obtain a chip mask layout; and forming the chip mask plate according to the chip mask layout.

15. The photolithography process according to claim 14, wherein:

the light-source optimization is performed using a method based on one of a genetic algorithm and a PSO algorithm.

16. The photolithography process according to claim 13, wherein:

the base substrate includes a substrate and a photoresist layer formed on the substrate.

17. A photolithography apparatus, comprising:

an input device, configured to provide a first test layout and a first light source, wherein the first test layout includes a plurality of test patterns;

a mask layout formation device, configured to form a mask layout according to the first test layout;

an exposure device, configured to form a plurality of exposed patterns by exposing the mask layout using the first light source;

a weak region acquisition device, configured to obtain a weak region including a plurality of test patterns in the first test layout, wherein a distance between adjacent test patterns in the weak region is a first distance, a distance between adjacent exposed patterns that correspond to the test patterns is a second distance, and the first distance is unequal to the second distance;

a re-layout device, configured to increase the distance between adjacent test patterns in the weak region by performing a re-layout one or multiple times on the weak region; and a light-source optimization device, configured to perform a light-source optimization one or multiple times on the light source according to the first test layout.

18. The photolithography apparatus according to claim 17, wherein the mask layout formation device further includes:

an initial chip mask layout formation device, configured to form an initial chip mask layout according to the first test layout; and a mask optimization device, configured to form the mask layout by performing a mask optimization one or multiple times on the initial chip mask layout, wherein the mask layout includes a plurality of mask patterns.

19. The photolithography apparatus according to claim 17, wherein re-layout device further includes:

a differential device, configured to acquire a distance incremental amount through finite-difference computation performed based on the exposed patterns and the test patterns; and an increase device, configured to increase the distance between adjacent test patterns in the weak region, such that the distance between adjacent test patterns is increased by the distance incremental amount.

* * * * *